United States Patent
Derderian (10) Patent No.: US 7,323,231 B2
(45) Date of Patent: Jan. 29, 2008

(54) APPARATUS AND METHODS FOR PLASMA VAPOR DEPOSITION PROCESSES

(75) Inventor: Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 10/683,606

(22) Filed: Oct. 9, 2003

(65) Prior Publication Data

US 2005/0087130 A1    Apr. 28, 2005

(51) Int. Cl.
*H05H 1/24* (2006.01)
*C23C 16/00* (2006.01)
*C08F 2/48* (2006.01)

(52) U.S. Cl. .................. 427/576; 427/248.1; 427/569; 427/508; 118/723 MW (58) Field of Classification Search ................ 427/237, 427/248.1, 250, 453, 576, 569
See application file for complete search history.

(56) References Cited

U.S. PATENT DOCUMENTS

| | | |
|---|---|---|
| 579,269 A | 3/1897 | Hent |
| 3,618,919 A | 11/1971 | Beck |
| 3,620,934 A | 11/1971 | Endle |
| 3,630,769 A | 12/1971 | Hart et al. |
| 3,630,881 A | 12/1971 | Lester et al. |
| 3,634,212 A | 1/1972 | Valayll et al. |
| 4,018,949 A | 4/1977 | Donakowski et al. |
| 4,242,182 A | 12/1980 | Popescu |
| 4,269,625 A | 5/1981 | Molenaar |
| 4,289,061 A | 9/1981 | Emmett |
| 4,313,783 A | 2/1982 | Davies et al. |
| 4,388,342 A | 6/1983 | Suzuki et al. |
| 4,397,753 A | 8/1983 | Czaja |
| 4,436,674 A | 3/1984 | McMenamin |
| 4,438,724 A | 3/1984 | Doehler et al. |

(Continued)

FOREIGN PATENT DOCUMENTS

DE    198 51 824 A1    5/2000

(Continued)

OTHER PUBLICATIONS

U.S. Appl. No. 10/767,298, filed Jan. 28, 2004, Zheng et al.

(Continued)

*Primary Examiner*—Timothy Meeks
*Assistant Examiner*—David Turocy
(74) *Attorney, Agent, or Firm*—Perkins Coie LLP (57) ABSTRACT

One aspect of the invention is directed toward a method of forming a conductive layer on a microfeature workpiece. In one embodiment, the method comprises placing a microfeature workpiece in a vapor reaction chamber, depositing an electrically conductive material onto the microfeature workpiece in a vapor deposition process by flowing a gas into a plasma zone of the vapor deposition chamber and transmitting energy into the plasma zone via a transmitting window. The energy transmitted through the window and into the plasma zone produces plasma from the gas. The plasma produced from the gas forms a conductive layer on the workpiece and a residual film on the window. This embodiment of the method further includes changing the residual film on the window to have a reduced transmissivity to the energy.

11 Claims, 3 Drawing Sheets

U.S. PATENT DOCUMENTS

| | | |
|---|---|---|
| 4,469,801 A | 9/1984 | Hirai et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,681,777 A | 7/1987 | Engelken et al. |
| 4,826,579 A | 5/1989 | Westfall |
| 4,894,132 A | 1/1990 | Tanaka et al. |
| 4,911,638 A | 3/1990 | Bayne et al. |
| 4,923,715 A * | 5/1990 | Matsuda et al. ............ 427/237 |
| 4,948,979 A | 8/1990 | Munakata et al. |
| 4,949,669 A | 8/1990 | Ishii et al. |
| 4,966,646 A | 10/1990 | Zdeblick |
| 4,977,106 A | 12/1990 | Smith |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,076,205 A | 12/1991 | Vowles et al. |
| 5,090,985 A | 2/1992 | Soubeyrand et al. |
| 5,091,207 A | 2/1992 | Tanaka |
| 5,131,752 A | 7/1992 | Yu et al. |
| 5,136,975 A | 8/1992 | Bartholomew et al. |
| 5,172,849 A | 12/1992 | Barten et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,286,296 A | 2/1994 | Sato et al. |
| 5,325,020 A | 6/1994 | Campbell et al. |
| 5,364,219 A | 11/1994 | Takahashi et al. |
| 5,366,557 A | 11/1994 | Yu |
| 5,377,429 A | 1/1995 | Sandhu et al. |
| 5,380,396 A | 1/1995 | Shikida et al. |
| 5,409,129 A | 4/1995 | Tsukada et al. |
| 5,418,180 A | 5/1995 | Brown |
| 5,427,666 A | 6/1995 | Mueller et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,453,124 A | 9/1995 | Moslehi et al. |
| 5,480,818 A | 1/1996 | Matsumoto et al. |
| 5,496,410 A | 3/1996 | Fukuda et al. |
| 5,498,292 A | 3/1996 | Ozaki |
| 5,500,256 A | 3/1996 | Watabe |
| 5,522,934 A | 6/1996 | Suzuki et al. |
| 5,536,317 A | 7/1996 | Crain et al. |
| 5,562,800 A | 10/1996 | Kawamura |
| 5,575,883 A | 11/1996 | Nishikawa et al. |
| 5,589,002 A | 12/1996 | Su |
| 5,589,110 A | 12/1996 | Motoda et al. |
| 5,592,581 A | 1/1997 | Okase |
| 5,595,606 A | 1/1997 | Fujikawa et al. |
| 5,599,513 A | 2/1997 | Masaki et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,693,288 A | 12/1997 | Nakamura |
| 5,716,796 A | 2/1998 | Bull et al. |
| 5,729,896 A | 3/1998 | Dalal et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Komino |
| 5,788,778 A | 8/1998 | Shang et al. |
| 5,792,269 A | 8/1998 | Deacon et al. |
| 5,792,700 A | 8/1998 | Turner et al. |
| 5,819,683 A | 10/1998 | Ikeda et al. |
| 5,820,641 A | 10/1998 | Gu et al. |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,294 A | 12/1998 | Young et al. |
| 5,851,849 A | 12/1998 | Comizzoli et al. |
| 5,865,417 A | 2/1999 | Harris et al. |
| 5,866,986 A | 2/1999 | Pennington |
| 5,868,159 A | 2/1999 | Loan et al. |
| 5,879,459 A | 3/1999 | Gadgil et al. |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,911,238 A | 6/1999 | Bump et al. |
| 5,932,286 A | 8/1999 | Beinglass et al. |
| 5,953,634 A | 9/1999 | Kajita et al. |
| 5,956,613 A | 9/1999 | Zhao et al. |
| 5,958,140 A | 9/1999 | Arami et al. |
| 5,961,775 A | 10/1999 | Fujimura et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 6,006,694 A * | 12/1999 | DeOrnellas et al. ...... 118/723 I |
| 6,008,086 A | 12/1999 | Schuegraf et al. |
| 6,022,483 A | 2/2000 | Aral |
| 6,032,923 A | 3/2000 | Biegelsen et al. |
| 6,039,557 A | 3/2000 | Unger et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,090,210 A | 7/2000 | Ballance et al. |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,142,163 A | 11/2000 | McMillin et al. |
| 6,143,077 A | 11/2000 | Ikeda et al. |
| 6,143,078 A | 11/2000 | Ishikawa et al. |
| 6,143,659 A | 11/2000 | Leem |
| 6,144,060 A | 11/2000 | Park et al. |
| 6,149,123 A | 11/2000 | Harris et al. |
| 6,159,297 A | 12/2000 | Herchen et al. |
| 6,159,298 A | 12/2000 | Saito et al. |
| 6,160,243 A | 12/2000 | Cozad |
| 6,161,500 A | 12/2000 | Kopacz et al. |
| 6,173,673 B1 | 1/2001 | Golovato et al. |
| 6,174,366 B1 | 1/2001 | Ihantola |
| 6,174,377 B1 | 1/2001 | Doering et al. |
| 6,174,809 B1 | 1/2001 | Kang et al. |
| 6,178,660 B1 | 1/2001 | Emmi et al. |
| 6,182,603 B1 | 2/2001 | Shang et al. |
| 6,183,563 B1 | 2/2001 | Choi et al. |
| 6,190,459 B1 | 2/2001 | Takeshita et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,200,415 B1 | 3/2001 | Maraschin |
| 6,203,613 B1 | 3/2001 | Gates et al. |
| 6,206,967 B1 | 3/2001 | Mak et al. |
| 6,206,972 B1 | 3/2001 | Dunham |
| 6,207,937 B1 | 3/2001 | Stoddard et al. |
| 6,210,754 B1 | 4/2001 | Lu et al. |

| | | | | | | |
|---|---|---|---|---|---|---|
| 6,211,033 B1 | 4/2001 | Sandhu et al. | | 6,596,085 B1 | 7/2003 | Schmitt et al. |
| 6,211,078 B1 | 4/2001 | Mathews | | 6,602,346 B1 | 8/2003 | Gochberg |
| 6,214,714 B1 | 4/2001 | Wang et al. | | 6,622,104 B2 | 9/2003 | Wang et al. |
| 6,237,394 B1 | 5/2001 | Harris et al. | | 6,630,201 B2 | 10/2003 | Chiang et al. |
| 6,237,529 B1 | 5/2001 | Spahn | | 6,635,965 B1 | 10/2003 | Lee et al. |
| 6,245,192 B1 | 6/2001 | Dhindsa et al. | | 6,638,672 B2 | 10/2003 | Deguchi |
| 6,251,190 B1 | 6/2001 | Mak et al. | | 6,638,859 B2 | 10/2003 | Sneh et al. |
| 6,255,222 B1 | 7/2001 | Xia et al. | | 6,638,879 B2 | 10/2003 | Hsieh et al. |
| 6,263,829 B1 | 7/2001 | Schneider et al. | | 6,641,673 B2 | 11/2003 | Yang |
| 6,270,572 B1 | 8/2001 | Kim et al. | | 6,663,713 B1 | 12/2003 | Robles et al. |
| 6,273,954 B2 | 8/2001 | Nishikawa et al. | | 6,673,196 B1 | 1/2004 | Oyabu |
| 6,277,763 B1 | 8/2001 | Kugimiya et al. | | 6,689,220 B1* | 2/2004 | Nguyen ..................... 118/695 |
| 6,280,584 B1 | 8/2001 | Kumar et al. | | 6,704,913 B2 | 3/2004 | Rossman |
| 6,287,965 B1 | 9/2001 | Kang et al. | | 6,705,345 B1 | 3/2004 | Bifano |
| 6,287,980 B1 | 9/2001 | Hanazaki et al. | | 6,706,334 B1 | 3/2004 | Kobayashi et al. |
| 6,290,491 B1 | 9/2001 | Shahvandi et al. | | 6,734,020 B2 | 5/2004 | Lu et al. |
| 6,291,337 B1 | 9/2001 | Sidhwa | | 6,770,145 B2 | 8/2004 | Saito et al. |
| 6,294,394 B1 | 9/2001 | Erickson et al. | | 6,800,139 B1 | 10/2004 | Shinriki et al. |
| 6,297,539 B1 | 10/2001 | Ma et al. | | 6,807,971 B2 | 10/2004 | Saito et al. |
| 6,302,964 B1 | 10/2001 | Umotoy et al. | | 6,818,067 B2 | 11/2004 | Doering et al. |
| 6,302,965 B1 | 10/2001 | Umotoy et al. | | 6,818,249 B2 | 11/2004 | Derderian |
| 6,303,953 B1 | 10/2001 | Doan et al. | | 6,821,347 B2 | 11/2004 | Carpenter et al. |
| 6,305,314 B1 | 10/2001 | Sneh et al. | | 6,830,652 B1 | 12/2004 | Ohmi et al. |
| 6,309,161 B1 | 10/2001 | Hofmeister | | 6,838,114 B2 | 1/2005 | Carpenter et al. |
| 6,315,859 B1 | 11/2001 | Donohoe | | 6,845,734 B2 | 1/2005 | Carpenter et al. |
| 6,328,803 B2 | 12/2001 | Rolfson et al. | | 6,849,131 B2 | 2/2005 | Chen et al. |
| 6,329,297 B1 | 12/2001 | Balish et al. | | 6,861,094 B2 | 3/2005 | Derderian et al. |
| 6,333,272 B1 | 12/2001 | McMillin et al. | | 6,861,356 B2 | 3/2005 | Matsuse et al. |
| 6,334,928 B1 | 1/2002 | Sekine et al. | | 6,881,295 B2 | 4/2005 | Nagakura et al. |
| 6,342,277 B1 | 1/2002 | Sherman | | 6,887,521 B2 | 5/2005 | Basceri |
| 6,346,477 B1 | 2/2002 | Kaloyeros et al. | | 6,905,547 B1 | 6/2005 | Londergan et al. |
| 6,347,602 B2 | 2/2002 | Goto et al. | | 6,905,549 B2 | 6/2005 | Okuda et al. |
| 6,347,918 B1 | 2/2002 | Blahnik | | 6,966,936 B2 | 11/2005 | Yamasaki et al. |
| 6,355,561 B1 | 3/2002 | Sandhu et al. | | 6,991,684 B2 | 1/2006 | Kannan et al. |
| 6,358,323 B1 | 3/2002 | Schmitt et al. | | 7,022,184 B2 | 4/2006 | Van Wijck et al. |
| 6,364,219 B1 | 4/2002 | Zimmerman et al. | | 7,086,410 B2 | 8/2006 | Chouno et al. |
| 6,374,831 B1 | 4/2002 | Chandran et al. | | 2001/0001952 A1 | 5/2001 | Nishizawa et al. |
| 6,383,300 B1 | 5/2002 | Saito et al. | | 2001/0010309 A1 | 8/2001 | Van Bilsen |
| 6,387,185 B2 | 5/2002 | Doering et al. | | 2001/0011526 A1 | 8/2001 | Doering et al. |
| 6,387,207 B1 | 5/2002 | Janakiraman et al. | | 2001/0012697 A1 | 8/2001 | Mikata |
| 6,402,806 B1 | 6/2002 | Schmitt et al. | | 2001/0024387 A1 | 9/2001 | Raaijmakers et al. |
| 6,402,849 B2 | 6/2002 | Kwag et al. | | 2001/0029892 A1 | 10/2001 | Cook et al. |
| 6,415,736 B1 | 7/2002 | Hao et al. | | 2001/0045187 A1 | 11/2001 | Uhlenbrock |
| 6,419,462 B1 | 7/2002 | Horie et al. | | 2001/0050267 A1* | 12/2001 | Hwang et al. ................. 216/67 |
| 6,420,230 B1 | 7/2002 | Derderian et al. | | 2001/0054484 A1 | 12/2001 | Komino |
| 6,420,742 B1 | 7/2002 | Ahn et al. | | 2002/0000202 A1 | 1/2002 | Yuda et al. |
| 6,425,168 B1 | 7/2002 | Takaku et al. | | 2002/0007790 A1 | 1/2002 | Park |
| 6,428,859 B1 | 8/2002 | Chiang et al. | | 2002/0020353 A1 | 2/2002 | Redemann et al. |
| 6,432,256 B1 | 8/2002 | Raoux | | 2002/0042205 A1 | 4/2002 | McMillin et al. |
| 6,432,259 B1 | 8/2002 | Noorbakhsh et al. | | 2002/0043216 A1 | 4/2002 | Hwang et al. |
| 6,432,831 B2 | 8/2002 | Dhindsa et al. | | 2002/0052097 A1 | 5/2002 | Park |
| 6,435,865 B1 | 8/2002 | Tseng et al. | | 2002/0073924 A1 | 6/2002 | Chiang et al. |
| 6,444,039 B1 | 9/2002 | Nguyen | | 2002/0076490 A1 | 6/2002 | Chiang et al. |
| 6,450,117 B1 | 9/2002 | Murugesh et al. | | 2002/0076507 A1 | 6/2002 | Chiang et al. |
| 6,451,119 B2 | 9/2002 | Sneh et al. | | 2002/0076508 A1 | 6/2002 | Chiang et al. |
| 6,458,416 B1 | 10/2002 | Derderian et al. | | 2002/0094689 A1 | 7/2002 | Park |
| 6,461,436 B1 | 10/2002 | Campbell et al. | | 2002/0100418 A1 | 8/2002 | Sandhu et al. |
| 6,461,931 B1 | 10/2002 | Eldridge | | 2002/0104481 A1 | 8/2002 | Chiang et al. |
| 6,503,330 B1 | 1/2003 | Sneh et al. | | 2002/0108714 A1 | 8/2002 | Doering et al. |
| 6,506,254 B1 | 1/2003 | Bosch et al. | | 2002/0110991 A1 | 8/2002 | Li |
| 6,508,268 B1 | 1/2003 | Kouketsu et al. | | 2002/0127745 A1 | 9/2002 | Lu et al. |
| 6,509,280 B2 | 1/2003 | Choi | | 2002/0129768 A1 | 9/2002 | Carpernter et al. |
| 6,534,007 B1 | 3/2003 | Blonigan et al. | | 2002/0132374 A1 | 9/2002 | Basceri et al. |
| 6,534,395 B2 | 3/2003 | Werkhoven et al. | | 2002/0144655 A1 | 10/2002 | Chiang et al. |
| 6,540,838 B2 | 4/2003 | Sneh et al. | | 2002/0146512 A1 | 10/2002 | Rossman |
| 6,541,353 B1 | 4/2003 | Sandhu et al. | | 2002/0162506 A1 | 11/2002 | Sneh et al. |
| 6,551,929 B1 | 4/2003 | Kori et al. | | 2002/0164420 A1 | 11/2002 | Derderian et al. |
| 6,562,140 B1 | 5/2003 | Bondestam et al. | | 2002/0185067 A1 | 12/2002 | Upham |
| 6,562,141 B2 | 5/2003 | Clarke | | 2002/0195056 A1 | 12/2002 | Sandhu et al. |
| 6,573,184 B2 | 6/2003 | Park | | 2002/0195145 A1 | 12/2002 | Lowery et al. |
| 6,579,372 B2 | 6/2003 | Park | | 2002/0195201 A1 | 12/2002 | Beer |
| 6,579,374 B2 | 6/2003 | Bondestam et al. | | 2002/0197402 A1 | 12/2002 | Chiang et al. |
| 6,585,823 B1 | 7/2003 | Van Wijck | | 2003/0000473 A1 | 1/2003 | Chae et al. |

| | | |
|---|---|---|
| 2003/0003697 A1 | 1/2003 | Agarwal et al. |
| 2003/0003730 A1 | 1/2003 | Li |
| 2003/0013320 A1 | 1/2003 | Kim et al. |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0027431 A1 | 2/2003 | Sneh et al. |
| 2003/0031794 A1 | 2/2003 | Tada et al. |
| 2003/0037729 A1 | 2/2003 | DeDontney et al. |
| 2003/0049372 A1 | 3/2003 | Cook et al. |
| 2003/0060030 A1 | 3/2003 | Lee et al. |
| 2003/0066483 A1 | 4/2003 | Lee et al. |
| 2003/0070609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0079838 A1* | 5/2003 | Brcka .................. 156/345.48 |
| 2003/0094903 A1 | 5/2003 | Tao et al. |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |
| 2003/0159780 A1 | 8/2003 | Carpenter et al. |
| 2003/0192645 A1 | 10/2003 | Liu |
| 2003/0194862 A1 | 10/2003 | Mardian et al. |
| 2003/0200926 A1 | 10/2003 | Dando et al. |
| 2003/0203109 A1 | 10/2003 | Dando et al. |
| 2003/0213435 A1 | 11/2003 | Okuda et al. |
| 2004/0000270 A1 | 1/2004 | Carpenter et al. |
| 2004/0003777 A1 | 1/2004 | Carpenter et al. |
| 2004/0007188 A1 | 1/2004 | Burkhart et al. |
| 2004/0025786 A1 | 2/2004 | Kontani et al. |
| 2004/0035358 A1 | 2/2004 | Basceri et al. |
| 2004/0040502 A1 | 3/2004 | Basceri et al. |
| 2004/0040503 A1 | 3/2004 | Basceri et al. |
| 2004/0083959 A1 | 5/2004 | Carpernter et al. |
| 2004/0083960 A1 | 5/2004 | Dando |
| 2004/0083961 A1 | 5/2004 | Basceri |
| 2004/0089240 A1 | 5/2004 | Dando et al. |
| 2004/0099377 A1 | 5/2004 | Newton et al. |
| 2004/0124131 A1 | 7/2004 | Aitchison et al. |
| 2004/0154538 A1 | 8/2004 | Carpenter et al. |
| 2004/0226507 A1 | 11/2004 | Carpenter et al. |
| 2004/0238123 A1 | 12/2004 | Becknell et al. |
| 2005/0016956 A1 | 1/2005 | Liu et al. |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1 | 3/2005 | Zheng et al. |
| 2005/0048742 A1 | 3/2005 | Dip et al. |
| 2005/0059261 A1 | 3/2005 | Basceri et al. |
| 2005/0061243 A1 | 3/2005 | Sarigiannis et al. |
| 2005/0081786 A1 | 4/2005 | Kubista et al. |
| 2005/0087130 A1 | 4/2005 | Derderian |
| 2005/0087132 A1 | 4/2005 | Dickey et al. |
| 2005/0087302 A1 | 4/2005 | Mardian |
| 2005/0217582 A1 | 10/2005 | Kim et al. |
| 2006/0115957 A1 | 6/2006 | Basceri et al. |
| 2006/0121689 A1 | 6/2006 | Basceri et al. |
| 2006/0134345 A1 | 6/2006 | Rueger et al. |
| 2006/0165873 A1 | 7/2006 | Rueger et al. |
| 2006/0198955 A1 | 9/2006 | Zheng et al. |
| 2006/0204649 A1 | 9/2006 | Beaman et al. |
| 2006/0205187 A1 | 9/2006 | Zheng et al. |
| 2006/0213440 A1 | 9/2006 | Zheng et al. |
| 2006/0237138 A1 | 10/2006 | Qin |

FOREIGN PATENT DOCUMENTS

| | | |
|---|---|---|
| EP | 1 167 569 A1 | 1/2002 |
| JP | 62235728 | 10/1987 |
| JP | 62263629 | 11/1987 |
| JP | 63-020490 | 1/1988 |
| JP | 63020490 A * | 1/1988 |
| JP | 63111177 A * | 5/1988 |
| JP | 63234198 | 9/1988 |
| JP | 63-256460 A | 10/1988 |
| JP | 1-273991 A | 11/1989 |
| JP | 4-100533 A | 4/1992 |
| JP | 4-213818 A | 8/1992 |
| JP | 6054443 | 2/1994 |
| JP | 6-151558 A | 5/1994 |
| JP | 6-342785 A | 12/1994 |
| JP | 8-34678 A | 2/1996 |
| JP | 9-82650 A | 3/1997 |
| JP | 10-223719 A | 8/1998 |
| JP | 11-172438 A | 6/1999 |
| JP | 2001-82682 A | 3/2001 |
| JP | 2001-261375 A | 9/2001 |
| JP | 2002-164336 A | 6/2002 |
| JP | 2001-254181 A | 9/2002 |
| KR | 2005112371 | 11/2005 |
| SU | 598630 | 3/1978 |
| WO | WO-98/37258 A1 | 8/1998 |
| WO | WO-99/06610 A1 | 2/1999 |
| WO | WO-00/40772 A1 | 7/2000 |
| WO | WO-00/63952 A1 | 10/2000 |
| WO | WO-00/65649 A1 | 11/2000 |
| WO | WO-00/79019 A1 | 12/2000 |
| WO | WO-01/32966 | 5/2001 |
| WO | WO-01/46490 A1 | 6/2001 |
| WO | WO-02/45871 A1 | 6/2002 |
| WO | WO-02/48427 A1 | 6/2002 |
| WO | WO-02/073329 A2 | 9/2002 |
| WO | WO-02/073660 A2 | 9/2002 |
| WO | WO-02/081771 A2 | 10/2002 |
| WO | WO-02/095807 A2 | 11/2002 |
| WO | WO-03/008662 A2 | 1/2003 |
| WO | WO-03/016587 A1 | 2/2003 |
| WO | WO-03/028069 A2 | 4/2003 |
| WO | WO-03/033762 A1 | 4/2003 |
| WO | WO-03/035927 A2 | 5/2003 |
| WO | WO-03/052807 A1 | 6/2003 |

OTHER PUBLICATIONS

U.S. Appl. No. 11/027,825, filed Dec. 29, 2004, Derderian et al.
U.S. Appl. No. 10/933,604, filed Sep. 2, 2004, Carpenter et al.
U.S. Appl. No. 10/839,316, filed May 5, 2004, Saraglannis et al.
U.S. Appl. No. 10/814,573, filed Mar. 31, 2004, Gealy et al.
U.S. Appl. No. 11/043,629, filed Jan. 25, 2005, Rueger et al.
U.S. Appl. No. 11/018,142, filed Dec. 20, 2004, Rueger et al.
U.S. Appl. No. 10/840,571, filed May 6, 2004, Dando et al.
U.S. Appl. No. 10/859,883, filed Jun. 2, 2004, Miller et al.
U.S. Appl. No. 10/733,523, filed Oct. 10, 2003, Beaman et al.
U.S. Appl. No. 11/027,809, filed Dec. 29, 2004, Carpenter et al.
U.S. Appl. No. 09/651,037, filed Aug. 30, 2000, Mardian.
U.S. Appl. No. 10/365,085, filed Feb. 11, 2003, Carpenter et al.
U.S. Appl. No. 10/665,908, filed Sep. 18, 2003, Sarigiannis et al.
Integrated Process Systems Ltd., "ALD & CVD", 2 pages, retrieved from the Internet on Dec. 11, 2001, <http://www.ips-tech.com/eng/pro-p2-2.htm>.
Deublin Company, "Rotating Unions", 1 page, retrieved from the Internet on Feb. 4, 2002, <http://www.com/products/rotatingunions.htm>.
Cameron, I., "Atomic Layer Deposition Chamber Works at Low Temperatures", 2 pages, Electronic Times, Jul. 19, 2001, <http://www.electronictimes.com/story/OEG20010719S0042>.

Cutting Edge Optronics, 600W QCW Laser Diode Array, Part No. ARR48P600, 2 pages, Oct. 2001, <www.ceolaser.com>.

Henning, A.K., et al., "Microfluidic MEMS for Semiconductor Processing," IEEE Trans. Components, Packaging, and Manufacturing Technology B21, pp. 329-337, 1998.

Fitch, J.S., et al., "Pressure-Based Mass-Flow Control Using Thermopneumatically-Actuated Microvalves," Proceedings, Sensors and Actuators Workshop, pp. 162-165 (Transducers Research Foundation, Cleveland, OH, 1998).

Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).

Maillefer, D., et al., "A High-Performance Silicon Micropump for Disposable Drug Delivery Systems," pp. 413-417, IEEE, 2001.

Henning, A.K., et al., "A thermopneumatically actuated microvalve for liquid expansion and proportional control", Proceedings, TRANSDUCERS '97: 1997 International Solid State Sensors and Actuators Conference, pp. 825-828.

University of California, Berkeley, University Extension, "Atomic Layer Deposition," 5 pages, Sep. 24-25, 2001, <http://www.unex.berkeley.edu/eng/br225/1-1.html>.

Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.

Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.

Ready, J.F., "Effects Due to Absorption of Laser Radiation," Journal of Applied Physics, vol. 36, No. 2, pp. 462-468, Feb. 1965, Journal of Applied Physics, American Institute of Physics.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

Tokyo Electron Limited, Plasma Process System, Trias SPA, 1 page, retrieved from the Internet on Oct. 16, 2004, <http://www.tel.com/eng/products/spe/sdtriasspa.htm>.

Olsson, A., "Valve-less Diffuser Micropumps", ISSN 0281-2878, 66 pages, 1998.

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Henning, A.K. et al., "Contamination Reduction Using MEMS-Based, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Microfluidic MEMS," Proceedings, IEEE Aerospace Conference, Paper 4.906 (IEEE Press, Piscataway, NJ, 1998), 16 pages.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.

Deublin Company, "Sealing," 2 pages, retrieved from the Internet on Feb. 4, 2002, <http://www.deublin.com/products/sealing.htm>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

Takahashi, K et al., "Process Integration of 3D Chip Stack with Vertical Interconnection," pp. 601-609, 2004 Electronic Components and Technology Conference, IEEE, Jun. 2004.

Aera Corporation, "Fundamentals of Mass Flow Control," 1 page, retrieved from the Internet on Mar. 6, 2003, <http://www.aeramfc.com/funda.shtml>.

EMCO Flow Systems, "Mach One Mass Flow Controllers", 1 page, retrieved from the Internet on Nov. 7, 2003, <http://emcoflow.com/mach-one.htm>.

EMCO Flow Systems, Mach One Mass Flow Controller Product Brochure, 6 pages, retrieved from the Internet on Nov. 7, 2003, <http://www.emcoflow.com/literature/brochures_product_sheets/mach_one/mach_one_brochure_2_01.pdf>.

SemiZone, "EMCO Flow Systems Granted Patent for the Mach One Mass Flow Controller for the Semiconductor Industry (Jun. 28, 2001)", 2 pages, retrieved from the Internet on Nov. 7, 2003, <http://www.semizone.com/news/item?news_item_id=100223>.

MKS Instruments, Data Sheet, Downstream Plasma Source, Type AX7610, 4 pages, Dec. 2002, <http://www.mksinst.com/docs/UR/ASTEXax7610DS.pdf>.

MKS Instruments, ASTeX® Microwave Plasma Sources and Subsystems, 1 page, retrieved from the Internet on Nov. 19, 2004, <http://www.mksinst.com/PRG2.html>.

* cited by examiner

APPARATUS AND METHODS FOR PLASMA VAPOR DEPOSITION PROCESSES

TECHNICAL FIELD

The present invention relates to plasma vapor deposition processes used to deposit layers of conductive materials or other types of materials in the fabrication of microfeature devices.

BACKGROUND

Thin film deposition techniques are widely used to build interconnects, plugs, gates, capacitors, transistors and other microfeatures in the manufacturing of microelectronic devices. Thin film deposition techniques are continually improved to meet the ever increasing demands of the industry because the microfeature sizes are constantly decreasing and the number of microfeature layers is constantly increasing. As a result, the density of microfeatures and the aspect ratios of depressions (e.g., the ratio of the depth to the size of the opening) are increasing. Thin film deposition techniques accordingly strive to produce highly uniform conformal layers that cover the sidewalls, bottoms, and corners in deep depressions that have very small openings.

One widely used thin film deposition technique is chemical vapor deposition (CVD). In a CVD system, one or more reactive precursors are mixed in a gas or vapor state and then the precursor mixture is presented to the surface of the workpiece. The surface of the workpiece catalyzes a reaction between the precursors to form a solid, thin film at the workpiece surface. A common way to catalyze the reaction at the surface of the workpiece is to heat the workpiece to a temperature that causes the reaction. CVD processes are routinely employed in many stages of manufacturing microelectronic components.

Figure 1A:
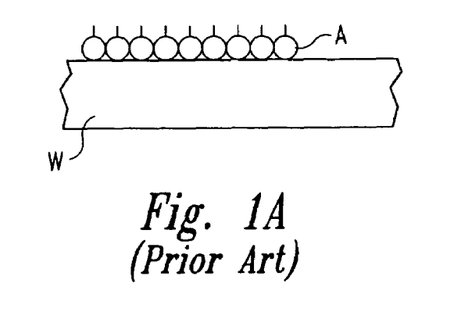
FIGS. 1A and 1B are schematic cross-sectional views of stages in ALD processing in accordance with the prior art.
Figure 1B:
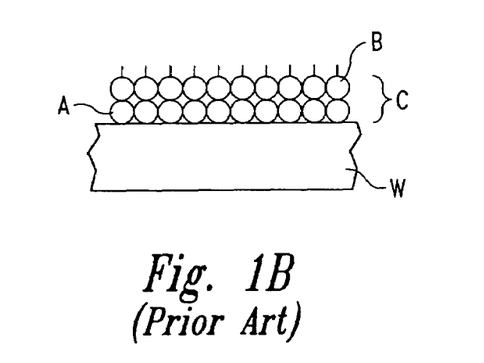

Atomic layer deposition (ALD) is another thin film deposition technique that is gaining prominence in manufacturing microfeatures on workpieces. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. The layer of A molecules is then exposed to another precursor gas containing B molecules. The A molecules react with the B molecules to form an extremely thin layer of solid material C on the workpiece W. Such thin layers are referred to herein as nanolayers because they are typically less than 1 nm thick and usually less than 2 Å thick. For example, each cycle may form a layer having a thickness of approximately 0.5-1.0 Å. The chamber is then purged again with a purge gas to remove excess B molecules.

Figure 2:
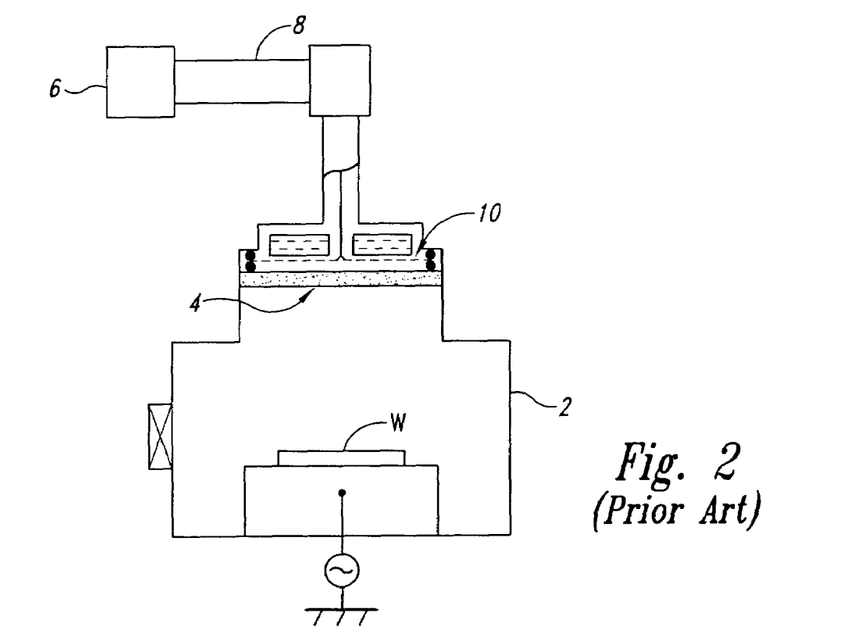
FIG. 2 is a schematic cross-sectional view of a plasma vapor deposition system in accordance with the prior art.

Another type of CVD process is plasma CVD in which energy is added to the gases inside the reaction chamber to form a plasma. U.S. Pat. No. 6,347,602 discloses several types of plasma CVD reactors. FIG. 2 schematically illustrates a conventional plasma processing system including a processing vessel 2 and a microwave transmitting window 4. The plasma processing system further includes a microwave generator 6 having a rectangular wave guide 8 and a disk-shaped antenna 10. The microwaves radiated by the antenna 10 propagate through the window 4 and into the processing vessel 2 to produce a plasma by electron cyclotron resonance. The plasma causes a desired material to be coated onto a workpiece W.

Although plasma CVD processes are useful for several applications, such as gate hardening, they are difficult to use in depositing conductive materials onto the wafer. For example, when the precursors are introduced into the chamber to create a metal layer, a secondary deposit of the metal accumulates on the interior surface of the window 4. This secondary deposit of metal builds up on the window 4 as successive microfeature workpieces are processed. One problem is that the secondary deposit of metal has a low transmissivity to the microwave energy radiating from the antenna 10. After a period of time, the secondary deposit of metal can block the microwave energy from propagating through the window 4 and into the processing vessel 2. The secondary deposit of metal is also generally non-uniform across the interior surface of the window 4. Therefore, the secondary deposit of metal on the window 4 can prevent the plasma from forming or produce non-uniform films on the workpiece.

To reduce the effects of the secondary deposit of metal on the window 4, the interior of the reaction chamber must be cleaned periodically. For example, flowing $ClF_3$ through the processing vessel 2 is one possible process to clean the window 4. This process, however, requires that the reaction chamber be cooled from a deposition temperature of approximately 400° C. to a cleaning temperature of approximately 300° C. The chamber is then purged of the cleaning agent and reheated back to the 400° C. deposition temperature. The cleaning process generally requires 3-4 hours to complete, and it may need to be performed frequently when depositing a metal onto the workpiece. Moreover, even after purging the cleaner from the chamber, residual molecules of the cleaner may remain in the chamber and contaminate the resulting film or otherwise disrupt the deposition process. Therefore, it has not been economical to use plasma vapor deposition processes for depositing certain types of metal layers or other conductive materials on microfeature workpieces.

DETAILED DESCRIPTION

A. Overview

Various embodiments of the present invention provide workpiece processing systems and methods for depositing materials onto microfeature workpieces. Many specific details of the invention are described below with reference to systems for depositing metals or other conductive materials onto microfeature workpieces, but the invention is also applicable to depositing other materials (e.g., dielectrics that have a low transmissivity to the plasma energy). The term "microfeature workpiece" is used throughout to include substrates upon which and/or in which microelectronic devices, micromechanical devices, data storage elements, read/write components, and other features are fabricated. For example, microfeature workpieces can be semiconductor wafers (e.g., silicon or gallium arsenide wafers), glass substrates, insulative substrates, and many other types of materials. The microfeature workpieces typically have submicron features with dimensions of a few nanometers or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 3-5B and the following text to provide a thorough understanding of particular embodiments of the invention. A person skilled in the art, however, will understand that the invention may have additional embodiments, or that the invention may be practiced without several of the details of the embodiments shown in FIGS. 3-5B.

One aspect of the invention is directed toward a method of forming a conductive layer on a microfeature workpiece. In one embodiment, the method comprises depositing an electrically conductive material onto a first microfeature workpiece in a vapor deposition process by flowing a gas into a plasma zone of a vapor deposition chamber and transmitting an energy into the plasma zone via a transmitting window. The energy transmitted through the window and into the plasma zone produces a plasma from the gas. The energy, for example, can be microwave radiation. The plasma produced from the gas forms a conductive layer on the workpiece using either CVD or ALD processes. The process of forming the conductive layer on the workpiece secondarily deposits a residual film on the window. The residual film has a first transmissivity to the plasma energy. This embodiment of the method further includes changing the residual film on the window to have a second transmissivity to the plasma energy. The second transmissivity to the plasma energy, for example, can be less than the first transmissivity. As such, changing the residual film to have a second transmissivity to the energy increases the amount of plasma energy that can propagate through the window and into the plasma zone.

Additional aspects of the invention are directed toward particular procedures for changing the residual film on the window to have the second transmissivity to the plasma energy. When the residual film is a conductive material, the procedure of changing the residual film to have a second transmissivity comprises transforming the conductive material on the window into a substantially dielectric material. For example, one embodiment comprises transforming the conductive material on the window into a substantially dielectric material by changing the conductive material to an oxide. Several suitable conductive materials that can be deposited on the workpiece and secondarily deposited on the window include Ti, Cu, Al, Ni and/or Co; all of these materials can be oxidized to become dielectric materials with a higher transmissivity to the plasma energy than they have in a non-oxidized state.

In still another aspect of the invention, the residual film of material secondarily deposited onto the window is changed or transformed to have a different transmissivity at a temperature that is at least relatively close to the temperature at which the material is deposited. For example, when a conductive material is deposited onto the workpiece and secondarily deposited onto the window at a deposition temperature, the electrically conductive material can be transformed into a substantially dielectric material at a maintenance temperature of approximately 80% to 120% of the deposition temperature. In other embodiments, the maintenance temperature is approximately 95% to 105% of the deposition temperature, or in still other embodiments the maintenance temperature is approximately equal to the deposition temperature. In several embodiments, the maintenance temperature can be within approximately 50° C. of the deposition temperature.

Still another aspect of the invention is directed toward an apparatus for depositing a material onto a microfeature workpiece. In one embodiment, the apparatus includes a reaction chamber having a workpiece holder and a plasma zone, an energy source configured to generate and direct a plasma energy toward the plasma zone, and a transmitting window through which the plasma energy can propagate from the energy source to the plasma zone. The apparatus further includes a controller coupled to a process gas unit and a maintenance gas unit. The process gas unit and the maintenance gas unit may be part of a single gas source system coupled to the reaction chamber. The controller contains computer operable instructions that cause: (a) a first gas and/or a second gas to be injected into the chamber in a manner that forms a conductive material on the workpiece; and (b) a maintenance gas to be injected into the chamber to increase the energy transmissivity of residual conductive material deposited on the window.

For ease of understanding, the following discussion is divided into two areas of emphasis. The first section discusses aspects of vapor deposition processing systems that may be used in accordance with selected embodiments of the invention. The second section outlines methods in accordance with embodiments of the invention.

Figure 3:
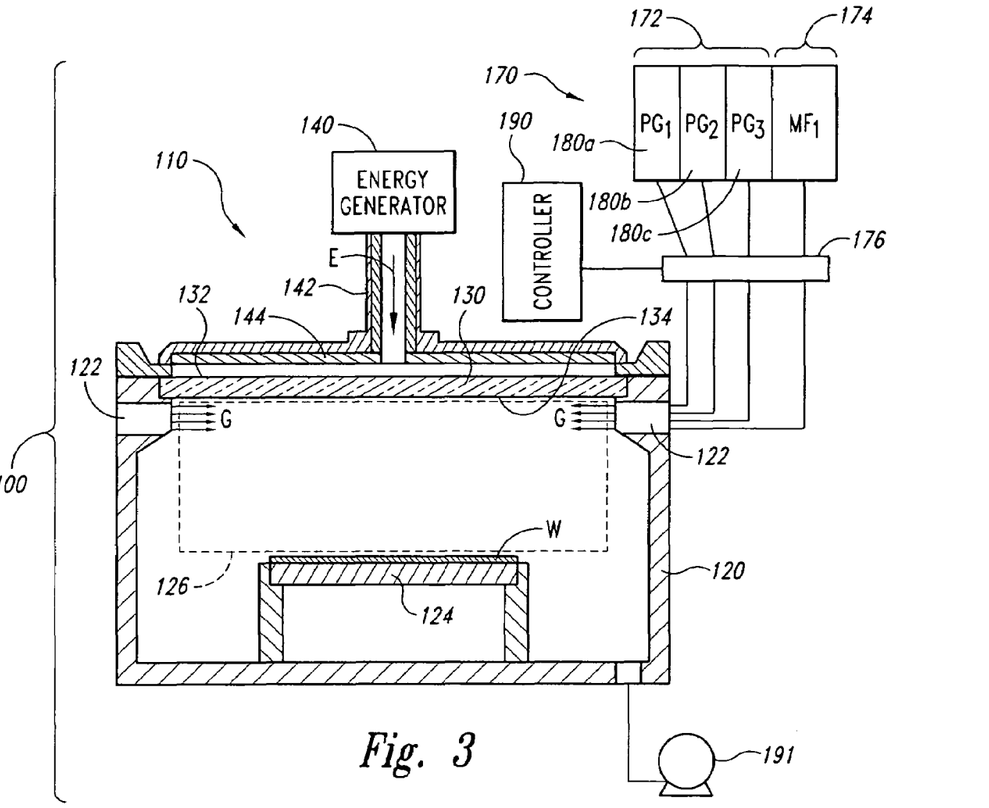
FIG. 3 is a schematic cross-sectional view of a plasma vapor deposition system in accordance with an embodiment of the invention.

B. Embodiments of Plasma Vapor Deposition Systems for Fabricating Microfeatures on a Workpiece FIG. 3 is a schematic cross-sectional view of a plasma vapor deposition system 100 for depositing a material onto a microfeature workpiece. In this embodiment, the deposition system 100 includes a reactor 110, a gas supply 170 configured to produce and/or contain gases, and a controller 190 containing computer operable instructions that cause the gas supply 170 to selectively deliver one or more gases to the reactor 110. The deposition system 100 can perform CVD, ALD, and/or pseudo ALD processes.

The deposition system 100 is suitable for plasma vapor deposition of several different types of materials, and it has particular utility for depositing conductive materials using microwave energy to generate a plasma in the chamber 110. To date, it has been difficult to deposit certain metals or other conductive materials without using a plasma enhanced system because one or more precursors may need additional energy to cause the reaction that forms the thin conductive film. Although prior art plasma vapor deposition systems provide the additional energy to cause the necessary reaction, they also secondarily deposit the conductive material onto the interior surface of the reactor 110. The secondary deposition of the conductive material on the interior surfaces of the reaction chamber impedes the microwave energy from entering the reaction chamber and forming the plasma. The prior art plasma vapor deposition chambers are thus unsuitable for depositing many metals. As explained in more detail below, the deposition system 100 resolves this problem by transforming the secondarily deposited material on the interior surfaces of the reactor 110 into a material that has a sufficient transmissivity to the microwave energy or other type of plasma energy. Several embodiments of the vapor deposition system 100, moreover, can transform the secondarily deposited material without having to significantly cool or otherwise shut down the deposition system 100.

Referring to the embodiment of the deposition system 100 shown in FIG. 3, the reactor 110 includes a reaction chamber 120, a gas distributor 122 coupled to the gas supply 170, a workpiece holder 124 for holding a workpiece W, and a plasma zone 126 where a plasma can be generated. The gas distributor 122 can be an annular antechamber having a plurality of ports for injecting or flowing the gases G into the reaction chamber 120. More specifically, the gas distributor 122 can be a manifold having a plurality of different conduits so that individual gases are delivered into the plasma zone 126 through dedicated ports.

The reactor 110 can further include a window 130 having a first surface 132 and a second surface 134. The window 130 can be a plate or pane of material through which energy propagates into the reaction chamber 120 to generate a plasma in the plasma zone 126. The window 130 accordingly has a high transmissivity to the plasma energy that generates the plasma. For example, when microwave energy is used to generate the plasma, the window 130 can be a quartz plate or other material that readily transmits microwaves.

The reactor 110 further includes an energy system having a generator 140 for generating a plasma energy, an energy guide 142 coupled to the generator 140, and an antenna 144 or other type of transmitter coupled to the energy guide 142. The generator 140 can be a microwave generator. For example, the generator 140 can produce microwave energy at 2.45 GHz or another frequency suitable for producing a plasma in the plasma zone 126. The generator 140 generates a plasma energy E that propagates through the energy guide 142 to the antenna 144, and the antenna 144 transmits the plasma energy E through the window 130 to the plasma zone 126.

Referring still to FIG. 3, the gas supply 170 can include a process gas module 172, a maintenance fluid module 174, and a valve system 176. The process gas module 172 can include a plurality of individual gas units 180 (identified by reference numbers 180a-c) for containing or producing process gases. In one embodiment, the process gas module 172 includes a first gas unit 180a for a first process gas $PG_1$, a second gas unit 180b for a second process gas $PG_2$, and a third gas unit 180c for a third process gas $PG_3$. The first process gas $PG_1$ can be a first precursor gas and the second process gas $PG_2$ can be a second precursor gas selected to react with each other to form the layer of material on the workpiece W. The third process gas $PG_3$ can be a purge gas, such as argon, for purging the first process gas PG, and/or the second process gas $PG_2$ from the reaction chamber 120 in ALD or CVD processes. The process gas module 172 is not limited to having three gas units 180a-c, but rather it can have any number of individual gas units required to provide the desired precursors and/or purge gases to the gas distributor 122. As such, the process gas module 172 can include more or fewer precursor gases and/or purge gases than shown on FIG. 3.

Figure 4:
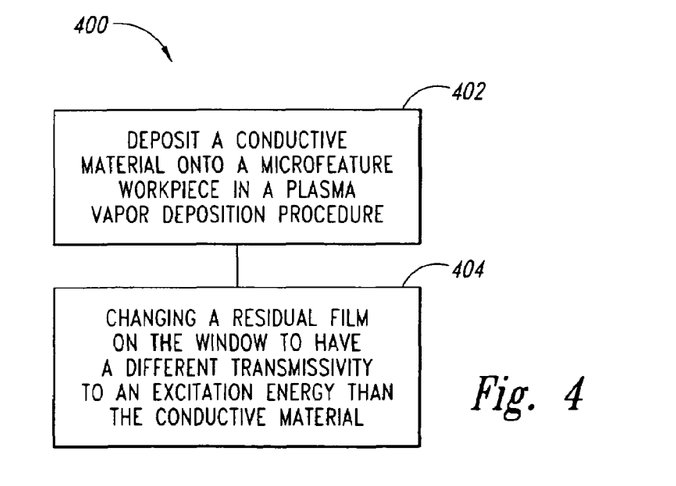
FIG. 4 is a flow chart of a method in accordance with an embodiment of the invention.
Figure 5A:
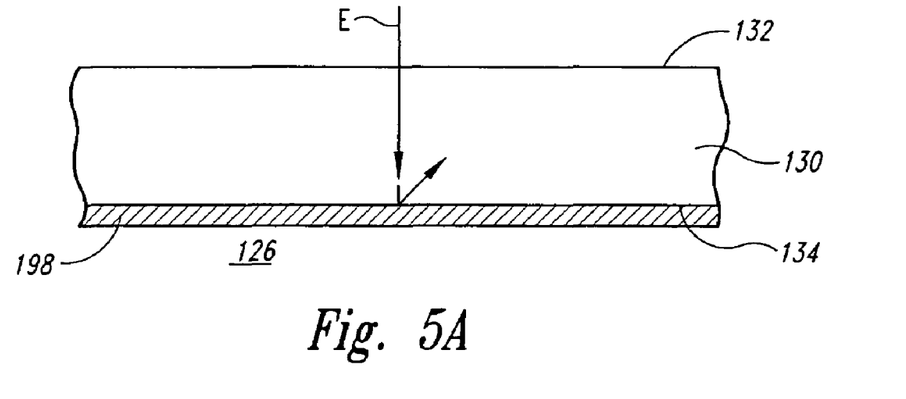
FIGS. 5A and 5B are schematic cross-sectional views of a portion of a transmitting window used in a plasma vapor deposition system at various stages of an embodiment of a method in accordance with the invention.

The maintenance fluid module 174 can include one or more maintenance fluids. At least one maintenance fluid $MF_1$ is selected to transform the conductive material produced by the reaction of the first and second process gases $PG_1$ and $PG_2$ into a benign material that is suitably transmissive to the plasma energy E in a preferred embodiment of the invention. The interaction between the maintenance fluid $MF_1$ and the process gases $PG_1$-$PG_3$ is explained in more detail below with reference to FIGS. 4-5B.

The controller 190 is coupled to the valve system 176. The controller 190 can also be coupled to the generator 140 and other components of the vapor deposition system 100, or additional controllers may be included to operate other components. The controller 190 can be a computer containing computer operable instructions in the form of hardware and/or software for controlling the valve system 176 in a manner set forth below with reference to the various methods discussed in FIGS. 4-5B.

C. Embodiments of Methods for Plasma Vapor Deposition of Conductive Material on Microfeature Workpieces FIG. 4 is a flow chart of a plasma vapor deposition method 400 for forming a conductive layer on a microfeature workpiece in accordance with an embodiment of the invention. The method 400 includes a plasma vapor deposition procedure 402 and a maintenance procedure 404. The plasma vapor deposition procedure 402 and the maintenance procedure 404 can be performed in the deposition system 100 shown in FIG. 3. The operation of the deposition system 100 shown in FIG. 3 in accordance with the method 400 shown in FIG. 4 enables the efficient use of plasma vapor deposition processes to deposit thin conductive films, such as titanium, on advanced microfeature workpieces that have very small feature sizes and high densities of features. Several embodiments of the plasma vapor deposition procedure 402 and the maintenance procedure 404 will be discussed below with reference to the plasma vapor deposition 100 system of FIG. 3.

One embodiment of the plasma vapor deposition procedure 402 comprises generating a plasma from a gas injected into the plasma zone 126 of the reaction chamber 120. For example, the controller 190 can cause the valve system 176 to inject a process gas into the plasma zone 126 via the gas distributor 122 while the generator 140 generates microwaves at a frequency selected to excite the molecules of the process gas to create a plasma. In a CVD process, the controller 190 operates the valve system 176 to inject the first and second process gases $PG_1$ and $PG_2$ into the plasma zone 126 concurrently. The first and second process gases $PG_1$ and $PG_2$ can be mixed in the gas distributor 122 or in the plasma zone 126 in CVD applications. In an ALD process, the controller 190 operates the valve system 176 to inject discrete pulses of the first and second process gases $PG_1$ and $PG_2$ into the plasma zone 126 at separate times. The controller 190, for example, can operate the valve assembly 176 to repeatedly produce a pulse train having pulses $PG_1$-$PG_3$-$PG_2$-$PG_3$; the first and second process gases $PG_1$ and $PG_2$ can be reactive precursors, and the third process gas $PG_3$ can be a purge gas. The plasma is generated from one or both of the first and second process gases $PG_1$ and $PG_2$ to form the conductive material. Referring to FIG. 5A, the conductive material formed from the plasma vapor deposition procedure 402 forms a residual film 198 on the second surface 134 of the window 130. In the case of depositing a conductive material comprising Ti, Cu, Al, Ni and/or Co, the residual film 198 on the window 130 blocks or impedes a substantial portion of the plasma energy E from entering the plasma zone 126.

The maintenance procedure 404 accordingly changes the residual film 198 on the second surface 134 of the window 130 to have a different transmissivity to the plasma energy E. In one embodiment, the maintenance procedure 404 involves increasing the transmissivity of the residual film 198 to be more transmissive to the plasma energy E. For example, the transmissivity of the residual film 198 can be increased by transforming the conductive material into a substantially dielectric material. When the conductive material comprises at least one of Ti, Cu, Al, Ni and/or Co, it can be transformed into a substantially dielectric material by an oxidizing process. In other embodiments, tungsten (w), nitrides (e.g., TiN, WN, etc.), borides, sulfides and carbides deposited on the wafer can form a residual film on the window 130, and then these materials can be transformed to be more transmissive to the plasma energy by an oxidization process or another process.

Figure 5B:
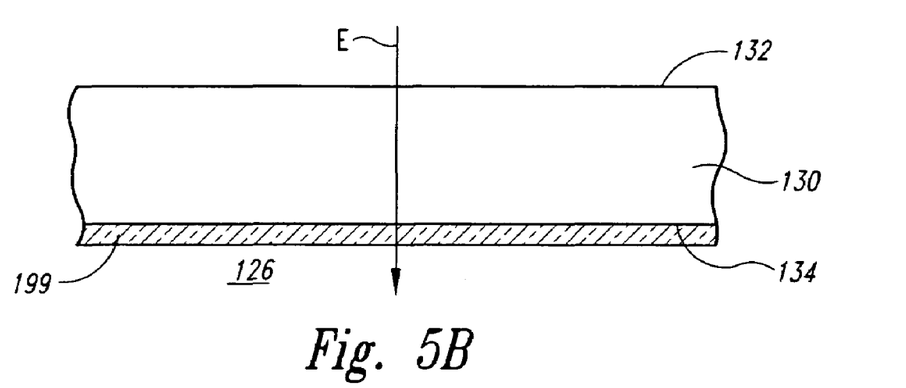

One specific embodiment of the maintenance procedure 404 includes injecting the maintenance fluid $MF_1$ into the reaction chamber 120 after terminating the plasma vapor deposition procedure 402 and removing the workpiece W from the reactor 110. In this embodiment, the controller 190 causes the valve system 176 to terminate the flows of the process gases $PG_1$-$PG_3$ and to initiate the flow of the maintenance fluid $MF_1$. Referring to FIG. 5B, the flow of maintenance fluid $MF_1$ transforms the residual film 198 into a benign film 199 that is more transmissive to the plasma energy E. The maintenance fluid $MF_1$ can comprise a fluid containing oxygen atoms or molecules, such as $O_2$, ozone, water, alcohol, etc.

The maintenance procedure 404 can be performed at a temperature approximately equal to the temperature of the plasma vapor deposition procedure 402. For example, if the plasma vapor deposition procedure 402 occurs at a process temperature $T_1$, then the maintenance procedure 404 can occur at a maintenance temperature $T_2$ approximately 80-120% of $T_1$. In other embodiments, the maintenance temperature $T_2$ can be 95-105% of $T_1$, or in still other embodiments the maintenance temperature $T_2$ can be approximately equal to $T_1$. In general, the maintenance temperature $T_2$ should be within approximately 50° C. of $T_1$ to limit the amount of time to cool/heat the reaction chamber 120 between the vapor deposition procedure 402 and the maintenance procedure 404.

The maintenance procedure 404 can be performed between each wafer or after a plurality of wafers have been processed through the vapor deposition system 100. For example, the controller 190 can operate the valve system 176 to deposit a conductive film on a plurality of wafers in a single-wafer process before the controller 190 stops the plasma vapor deposition procedure 402 and initiates the maintenance procedure 404.

One specific application of the plasma vapor deposition system 100 shown in FIG. 3 and the method 400 illustrated in FIGS. 4-5B is to deposit a titanium film using $TiCl_4$ and $H_2$ in an ALD process. A titanium film can be formed using an ALD process in which the first process gas $PG_1$ is $TiCl_4$, the second process gas $PG_2$ is $H_2$, and the third process gas $PG_3$ is argon or another purge gas. In this embodiment, the controller 190 effectuates the plasma vapor deposition procedure 402 by operating the valve system 176 to repeatedly inject a pulse train of $TiCl_4$ ($PG_1$), purge gas ($PG_3$), $H_2$ ($PG_2$), and purge gas ($PG_3$). The $H_2$ forms a plasma of hydrogen molecules as it is injected into the plasma zone 126. The unilayers of $TiCl_4$ on the workpiece W react with the hydrogen atoms from the plasma at the surface of the workpiece to create a titanium film across the workpiece. After the titanium film reaches a desired thickness, the workpiece W is removed from the reaction chamber 120 and the controller 190 operates the valve system 176 to initiate the maintenance procedure 404. More specifically, the controller 190 operates the valve system 176 to inject a maintenance fluid $MF_1$ containing oxygen into the reaction chamber 120 to transform the residual Ti film on the second surface 134 of the window 130 to titanium oxide. The controller 190 can then operate the valve system 176 to terminate the flow of maintenance fluid $MF_1$ from the maintenance fluid module 174. The maintenance procedure 404 can further include a pump out operation in which a vacuum pump 191 draws the maintenance fluid $MF_1$ out of the reaction chamber 120. In another embodiment, the maintenance procedure 404 can further include a purge step in which the controller 190 operates the valve system 176 to inject the purge gas $PG_3$ into the reaction chamber 120 after terminating the flow of the maintenance fluid $MF_1$ and pumping out the reaction chamber 120.

Another specific application of the plasma vapor deposition system 100 and the method 400 is to deposit a titanium film using $TiCl_4$ and $H_2$ in a CVD process or a pulsed CVD process. In this case, the controller 190 operates the valve system 176 so that the $TiCl_4$ ($PG_1$) and the $H_2$ ($PG_2$) are injected into the reaction chamber 120 simultaneously. The plasma energy E propagating from the antenna 144 generates a plasma from the $H_2$ molecules, which reacts with the $TiCl_4$ to form a Ti film across the face of the workpiece W. The controller 190 can continue to process additional wafers through the reaction chamber 120 in a continuation of the deposition procedure 402 until a residual titanium film builds up on the second surface 134 of the window 130 to a degree that it disrupts the plasma energy E from entering the plasma zone 126. The controller 190 can then operate the valve system 176 to initiate a flow of the maintenance fluid $MF_1$ into the reaction chamber 120 to oxidize or otherwise transform the residual titanium film to be more transmissive to the plasma energy E.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of depositing a layer onto a microfeature workpiece, comprising:
    (a) placing a microfeature workpiece in a vapor reaction chamber;
    (b) injecting a gas into a plasma zone in the vapor reaction chamber;
    (c) generating a plasma from the gas in the plasma zone that causes an electrically conductive material to be deposited on the microfeature workpiece and a window of the vapor reaction chamber at a deposition temperature and then remove the microfeature workpiece from the vapor reaction chamber;
    (d) transforming the electrically conductive material on the window into a substantially dielectric material after the microfeature workpiece is removed from the vapor reaction chamber using a process consisting of injecting a fluid containing at least oxygen into the vapor reaction chamber and maintaining the vapor reaction chamber at a maintenance temperature at least approximately equal to the deposition temperature; and
    repeating the steps of (a)-(d) with the transformed dielectric material remaining on the window.

2. The method of claim 1 wherein the conductive material deposited on the workpiece and the window comprises a metal, and transforming the conductive material on the window into a substantially dielectric material comprises changing the metal to a metal oxide.

3. The method of claim 1 wherein the conductive material deposited on the workpiece comprises at least one of Ti, W, Cu, Al, Ni and/or Co, and transforming the conductive material into a substantially dielectric material comprises oxidizing the at least one of the Ti, W, Cu, Al, Ni and/or Co to form a metal oxide.

4. The method of claim 1 wherein:
the conductive material is deposited onto the workpiece in a plasma deposition process comprising flowing a first gas into the reaction chamber during one interval, terminating the flow of the first gas, flowing a second gas into the reaction chamber during another interval after terminating the flow of the first gas, and terminating the flow of the second gas, wherein the plasma is generated from at least one of the first and second gases, and wherein the first and second gases react to form the conductive material on the workpiece and the window; and
transforming the conductive material into a substantially dielectric material comprises flowing a fluid containing oxygen into the reaction chamber.

5. The method of claim 1 wherein:
the conductive material is deposited onto the workpiece in a plasma vapor deposition process comprising concurrently flowing a first gas and a second gas into the reaction chamber, generating the plasma from at least one of the first and second gases, and terminating the flow of the first and second gases; and
transforming the electrically conductive material into a substantially dielectric material comprises flowing a fluid containing oxygen into the reaction chamber.

6. A method of forming a conductive layer on a microfeature workpiece, comprising:
depositing Titanium onto a plurality of microfeature workpieces in a vapor deposition process by flowing a gas into a plasma zone in a vapor reaction chamber at a first temperature and transmitting an energy into the plasma zone via a window of the vapor reaction chamber, wherein the energy produces a plasma from the gas that results in a residual film of Titanium having a first transmissivity to the energy being formed on the window;
changing the residual film of Titanium on the window to have a second transmissivity to the energy using a process consisting of injecting a fluid containing at least oxygen into the vapor reaction chamber and maintaining the vapor reaction chamber at a maintenance temperature at least approximately equal to the deposition temperature; and
depositing Titanium onto additional microfeature workpiece by repeating the vapor deposition process after changing the residual film to have the second transmissivity while the changed residual film remains on the window.

7. The method of claim 6 wherein the second transmissivity is greater than the first transmissivity.

8. The method of claim 6 wherein changing the residual film of Titanium comprises changing the residual film of Titanium to Titanium oxide.

9. The method of claim 6 wherein the residual film is formed on the window at a deposition temperature and the residual film is changed to have a second transmissivity greater than the first transmissivity at a maintenance temperature approximately equal to the deposition temperature.

10. A method of depositing a material onto a microfeature workpiece in an Atomic Layer Deposition process, comprising:
(a) depositing an electrically conductive material onto a first microfeature workpiece by flowing a gas into a plasma zone in a vapor reaction chamber at a first temperature and transmitting an energy into the plasma zone via a window of the vapor reaction chamber;
(b) increasing a transmissivity to the energy of a residual film of the conductive material formed on the window using a process consisting of injecting a fluid containing at least oxygen into the vapor reaction chamber; and maintaining the vapor reaction chamber at a second temperature at least approximately equal to the first temperature; and
repeating the steps of (a)-(b) with a second microfeature workpiece while the residual film remaining on the window, the residual film has the increased transmissivity.

11. The method of claim 10 wherein the residual film comprises Titanium and increasing the transmissivity of the residual film comprises changing Titanium to Titanium oxide.

* * * * *

UNITED STATES PATENT AND TRADEMARK OFFICE
CERTIFICATE OF CORRECTION

| | | |
|---|---|---|
| PATENT NO. | : 7,323,231 B2 | Page 1 of 1 |
| APPLICATION NO. | : 10/683606 | |
| DATED | : January 29, 2008 | |
| INVENTOR(S) | : Derderian | |

It is certified that error appears in the above-identified patent and that said Letters Patent is hereby corrected as shown below:

In column 10, line 33, in Claim 10, after "chamber" delete ";".

Signed and Sealed this

Thirteenth Day of May, 2008

JON W. DUDAS
*Director of the United States Patent and Trademark Office*